United States Patent
Diaz

(10) Patent No.: US 7,298,014 B2
(45) Date of Patent: Nov. 20, 2007

(54) USE OF VISCO-ELASTIC POLYMER TO REDUCE ACOUSTIC AND/OR VIBRATION INDUCED ERROR IN MICROELECTROMECHANICAL DEVICES AND SYSTEMS

(75) Inventor: Miguel C. Diaz, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/004,545

(22) Filed: Dec. 3, 2004

(65) Prior Publication Data

US 2006/0118943 A1 Jun. 8, 2006

(51) Int. Cl.
*H01L 27/14* (2006.01)
(52) U.S. Cl. .................... 257/414; 257/420
(58) Field of Classification Search ............. 257/414, 257/417, 420, 469, 678, 687, 788
See application file for complete search history.

(56) References Cited

U.S. PATENT DOCUMENTS

| 5,885,471 | A | 3/1999 | Ruben et al. |
|---|---|---|---|
| 6,600,661 | B1 | 7/2003 | Deeney |
| 2002/0039620 | A1 | 4/2002 | Shahinpoor et al. |
| 2002/0154481 | A1 | 10/2002 | Wagner |
| 2002/0158390 | A1 | 10/2002 | Braman et al. |
| 2002/0171901 | A1 | 11/2002 | Bernstein |
| 2003/0196852 | A1 | 10/2003 | Dean et al. |
| 2003/0201462 | A1 | 10/2003 | Pommer et al. |
| 2004/0100233 | A1 | 5/2004 | Ouyang et al. |
| 2004/0121528 | A1* | 6/2004 | Krulevitch et al. ......... 438/166 |

FOREIGN PATENT DOCUMENTS

| CA | 2094460 | 10/1993 |
|---|---|---|
| EP | 0 566 758 A | 10/1993 |
| JP | 2001324333 A | 11/2001 |

OTHER PUBLICATIONS

International Search Report dated Apr. 5, 2006, Application No. PCT/US2005/043476, 5 pages.
Silent Running, Silent Running Coating (SR 500), "Sprayable Noise Damping Liquid Coating," 1 page, prior to filing date of present application, 2003.
Silent Running, Silent Running Marine Coating (SR 1000), "SR 1000-Liquid Sound Dampening for Marine Use," 1 page, prior to filing date of present application, 2003.
Silent Running, Material Safety Data Sheet, "Product Identity: Noise Reduction & Anti-Vibration Coating (SR 500)," 2 pages, prior to filing date of present application, 2003.

(Continued)

*Primary Examiner*—Tuan H. Nguyen
(74) *Attorney, Agent, or Firm*—Evan Bundis, Esq.; Armstrong Teasdale LLP

(57) ABSTRACT

A system and method for reducing rectification error in a MEMS device cause by noise and/or vibration. A visco-elastic polymer is situated around at least part of the MEMs device, wherein the visco-elastic polymer converts at least some of the acoustic and/or vibration energy into heat, thereby reducing effects of the external acoustic and/or vibration energy on the MEMS device.

28 Claims, 7 Drawing Sheets

OTHER PUBLICATIONS

Silent Running, Silent Running Coating (SR 600), "Sprayable Anti-Moisture and Noise Damping Liquid Coating," 1 page, prior to filing date of present application, 2003.

Current, Inc., "Material Safety Data Sheet—SR 600," 3 pages, Sep. 25, 2003.

Current, Inc., "Material Safety Data Sheet—SR 1000," 3 pages, Sep. 25, 2003.

* cited by examiner

US 7,298,014 B2

USE OF VISCO-ELASTIC POLYMER TO REDUCE ACOUSTIC AND/OR VIBRATION INDUCED ERROR IN MICROELECTROMECHANICAL DEVICES AND SYSTEMS

FIELD OF THE INVENTION

The present invention generally relates to Micro-Electro-Mechanical Systems (MEMS), and more specifically, to packaging techniques for reducing acoustic and/or vibration induced error in such MEMS systems.

BACKGROUND OF THE INVENTION

Micro-Electro-Mechanical Systems (MEMS) are used in a wide variety of applications including inertial and guidance, optical, medical, as well as many other applications. In some of these applications, such as aeronautical, guidance, surface vehicle, marine, and down hole drilling applications, the MEMS devices can be subject to relatively harsh environments that may include substantial noise and/or vibration. In some cases, this noise and/or vibration can cause an error in the output of some MEMS devices, which is often referred to as a rectification error (RE). In some cases, the rectification error can reduce the sensitivity and/or accuracy of the MEMS device and/or system.

SUMMARY OF THE INVENTION

The present invention relates to systems and methods for reducing the effects of external noise and/or vibration on MEMS devices and/or systems. In an illustrative embodiment, a visco-elastic polymer is provided around at least part of a MEMs device or system, wherein the visco-elastic polymer converts at least some of the acoustic and/or vibration energy into heat, thereby reducing the effects of the external acoustic and/or vibration energy on the MEMS device and/or system.

In some cases, a MEMS device is provided in an enclosure, such as a device package. The visco-elastic polymer may be provided outside of the enclosure, inside the enclosure, directly on the MEMS device, or at any other place that may help reduce the effects of the external acoustic and/or vibration energy on the MEMS device. In some cases, the device package itself or parts thereof may be made from a visco-elastic polymer, or may include one or more layers or portions that are made from a visco-elastic polymer, if desired.

DETAILED DESCRIPTION OF THE DRAWINGS

Figure 1:
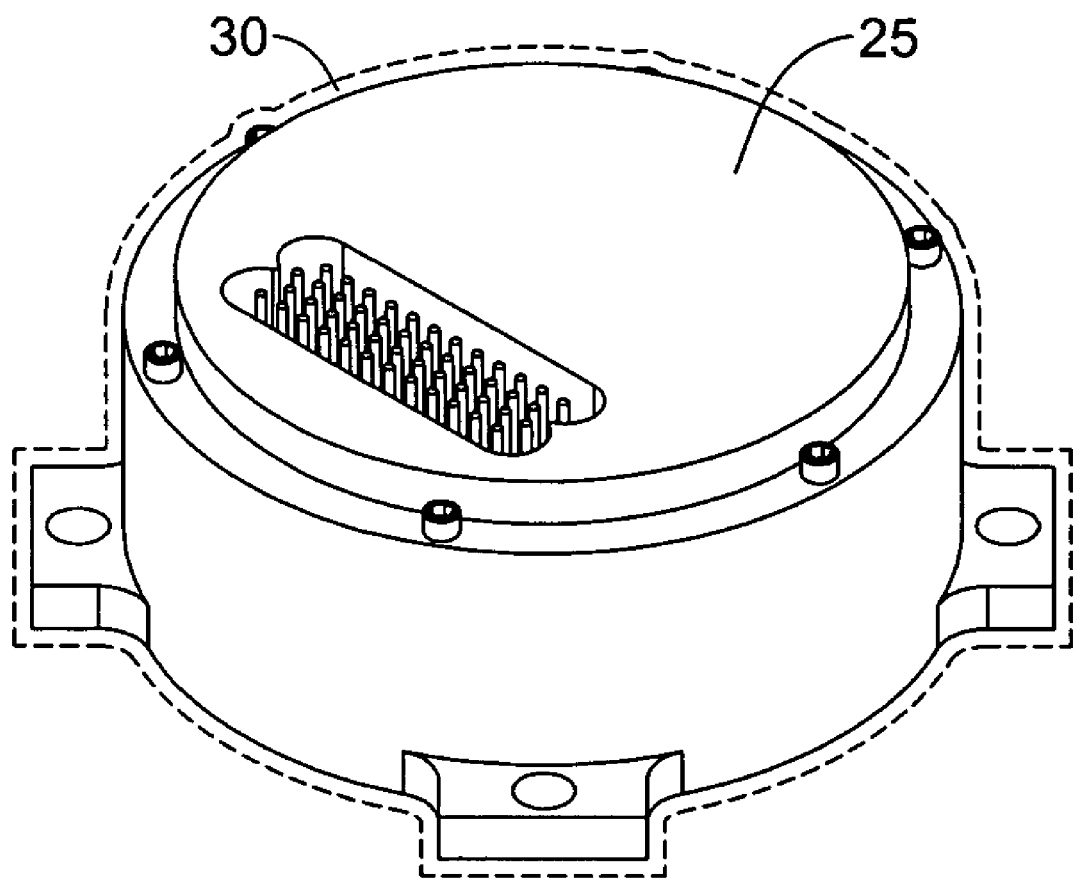
FIG. 1 is a perspective view of an illustrative MEMS IMU device with a visco-elastic polymer layer.

The following description should be read with reference to the drawings wherein like reference numerals indicate like elements throughout the several views. The detailed description and drawings show several embodiments which are meant to be illustrative of the claimed invention.

FIG. 1 is a perspective view of an illustrative MEMS IMU device 25 with a visco-elastic polymer layer 30. While a MEMS IMU 25 is shown in FIG. 1, it is contemplated that the visco-elastic polymer layer 30 may be used in conjunction with any suitable device or system, and especially, with any suitable device or system that is susceptible to a rectification error (RE) caused by external noise and/or vibration. In the illustrative embodiment of FIG. 1, the visco-elastic polymer 30 is situated around at least part of the MEMS IMU 25, and in some cases, completely around the MEMS IMU device 25.

The visco-elastic polymer 30 is a sound and vibration absorbing material. As external acoustic or vibration energy engages the visco-elastic polymer layer 30, the polymer 30 converts at least some of the energy into heat. Thus, any remaining acoustic and/or vibration energy that passes to the MEMS IMU device 25 is reduced, which in turn, may reduce the rectification error produced by the MEMS IMU device 25. Preferably, the visco-elastic polymer 30 has high adhesion characteristics such that it adheres well to the MEMS IMU 25. One illustrative visco-elastic polymer is SR-500, SR-600 or SR-1000, available from Current, Inc. of East Haven, Conn., under the trademark Silent Running.

Figure 2:
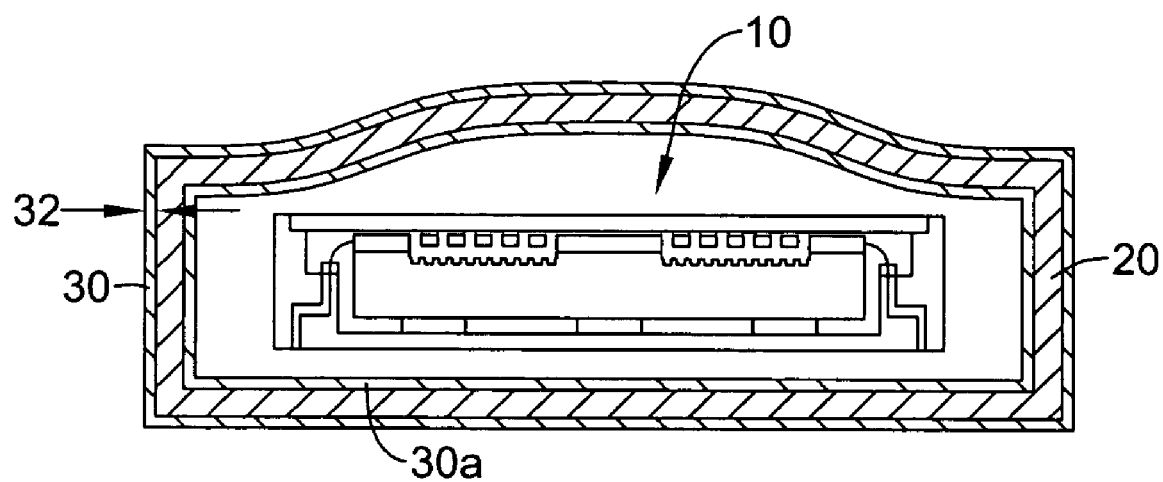
FIG. 2 is a schematic cross-sectional view of a visco-elastic polymer layer situated around an enclosure of the MEMS IMU device in FIG. 1.

FIG. 2 is a schematic cross-sectional side view of the visco-elastic polymer layer 30 situated around enclosure 20 of the MEMS IMU device 25 of FIG. 1. A MEMS device (e.g. die) is generally shown at 10, and is depicted here is a MEMS gyroscope die. However, it should be recognized that the device 10 may be any type of device, as desired. In the illustrative embodiment, the MEMS device 10 is enclosed within enclosure 20. The enclosure 20 may include a chassis or other packaging material used to package the MEMS device 10. In the illustrative embodiment, the visco-elastic polymer layer 30 is applied around the entire enclosure 20. However, this is not required in all embodiments. For example, the visco-elastic polymer layer 30 may be applied around only a portion of the enclosure 20.

Alternatively, or in addition, a visco-elastic polymer layer 30a may be situated along at least part of the inside of the enclosure 20. Also, and in some cases, the enclosure 20 itself or parts thereof may be made from a visco-elastic polymer, or may include one or more layers or portions that are made from a visco-elastic polymer, if desired.

In some cases, two or more coats of the visco-elastic polymer 30 may be applied. In one illustrative embodiment, the thickness 32 of the coats of visco-elastic polymer 30 may be 0.02 mils wet/coat. However, the number of coats and the thickness 32 of the coats may be tailored to the application at hand. Because many visco-elastic polymers are relatively light weight, the overall weight of certain devices and/or systems may be decreased relative to similar devices and/or systems that use other methods of shielding the MEMS device 10 from external noise and/or vibration.

Figure 3:
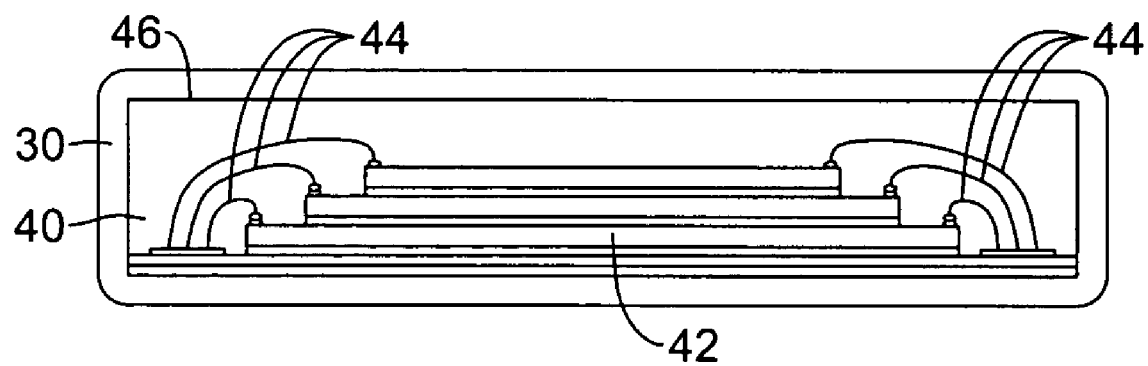
FIG. 3 is a schematic cross-sectional side view of a visco-elastic polymer layer situated around a MEMS multi-chip packaging (MCP)

FIG. 3 is a schematic cross-sectional side view of a visco-elastic polymer 30 layer situated around a MEMS multi-chip packaging (MCP) 40. The MCP 40 is depicted as a triple-stacked device 42 with wire bonds 40. However, it is contemplated that the MCP 40 may be any type of multi-chip package including a multi-chip package that has two or more die that lie generally along a common plane. The illustrative MCP 40 includes multiple MEMS devices (e.g. die) within a common enclosure 46. As can be seen, and in the illustrative embodiment, the enclosure 46 is surrounded by a visco-elastic polymer layer 30. As noted above, the visco-elastic polymer 30 may be used to help absorb external acoustical and/or vibration energy before the energy reaches the MEMS devices 42.

Figure 4:
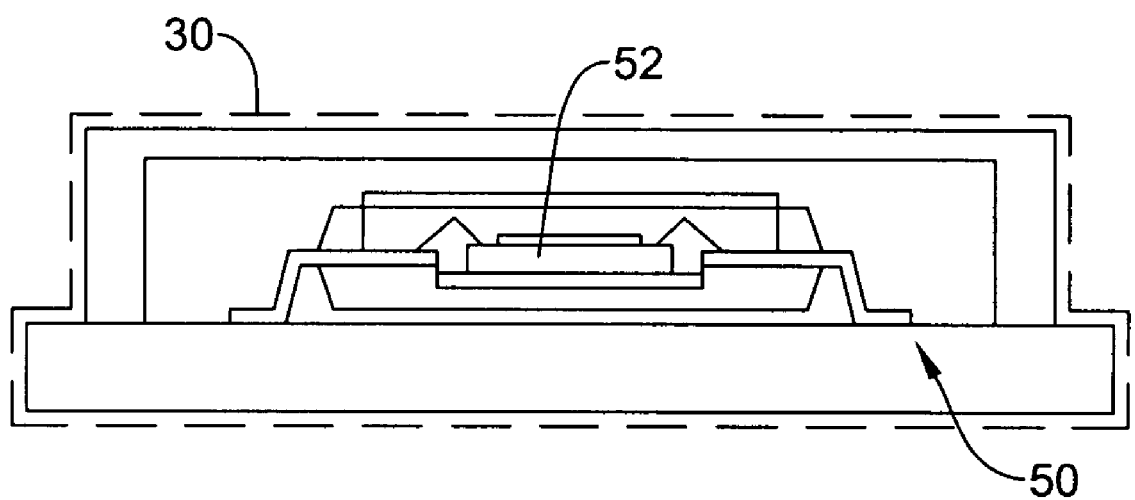
FIG. 4 is a schematic cross-sectional view of a visco-elastic polymer layer situated around a MEMS leadless chip carrier (LCC) 50.

FIG. 4 is a schematic cross-sectional view of a visco-elastic polymer layer 30 situated around a MEMS leadless chip carrier (LCC) package 50. The illustrative LCC package 50 provides an enclosure 54 for a MEMS device 52. A visco-elastic polymer layer 30 is shown situated around the enclosure 54 to help absorb the external acoustic and/or vibration energy, and in some cases, help reduce the rectification error of the MEMS device 52. In some cases, the device package itself or parts thereof may be made from a visco-elastic polymer, or may include one or more layers or portions that are made from a visco-elastic polymer, if desired.

Figure 5:
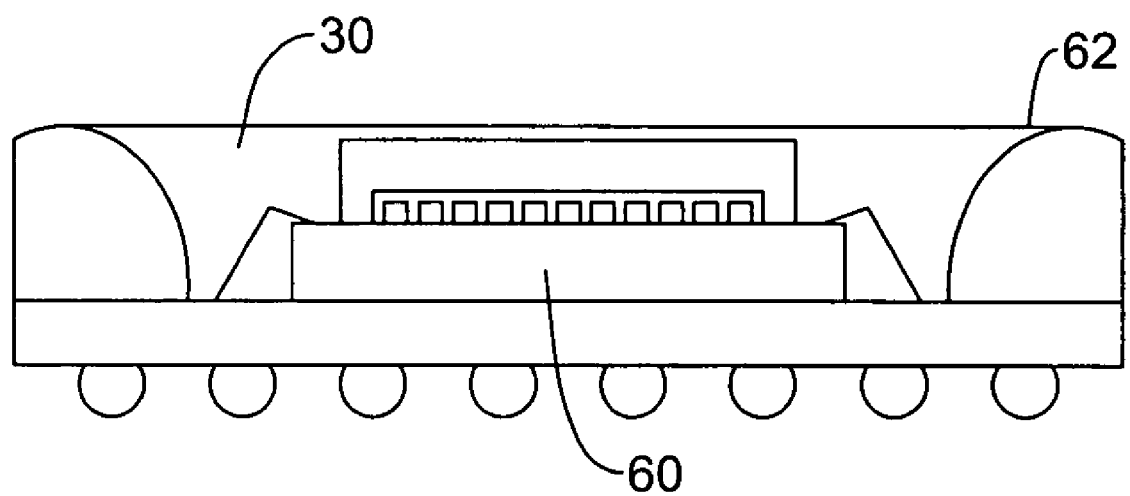
FIG. 5 is a schematic cross-sectional view of a MEMS device situated within an enclosure with an encapsulant fill of a visco-elastic polymer.

FIG. 5 is a schematic cross-sectional view of a MEMS device 60 situated within an enclosure 62 with an encapsulant fill of a visco-elastic polymer 30. In this illustrative embodiment, the visco-elastic polymer 30 is located within the enclosure 62. The visco-elastic polymer 30 may surrounds at least part of the MEMS device 60, inside the enclosure 62, to help mitigate the effect of external noise and/or vibration energy. In some cases, another visco-elastic polymer layer (not shown) may be situated around the outside of enclosure 62, if desired.

Figure 6:
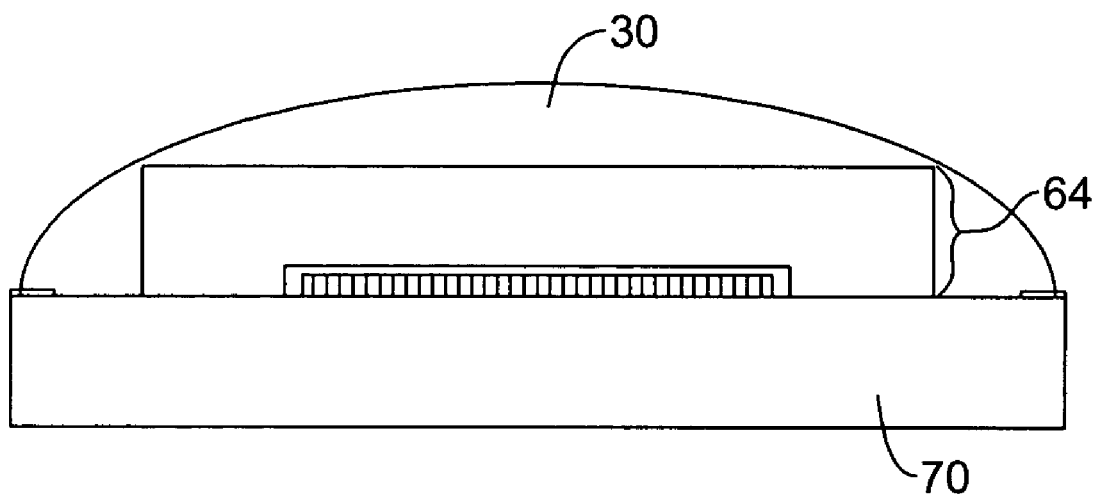
FIG. 6 is a schematic cross-sectional view of a MEMS device secured to a substrate.

FIG. 6 is a schematic cross-sectional view of a MEMS device 64 secured to a substrate 70. The substrate 70 may be a printed circuit board or any other suitable substrate. In some cases, the MEMS device 64 is in a package, and the package is secured to the substrate 70. In other embodiments, however, the MEMS device 64 may be directly secured to the substrate 70. As shown in FIG. 6, a visco-elastic polymer 30 is provided over at least part of the MEMS device 64, and in the illustrative embodiment, is dropped on as a blob over the MEMS device 64. As described above, the visco-elastic polymer 30 may help absorb external acoustic and/or vibration energy, and in some cases, may help reduce a rectification error of the MEMS device 64.

Figure 7:
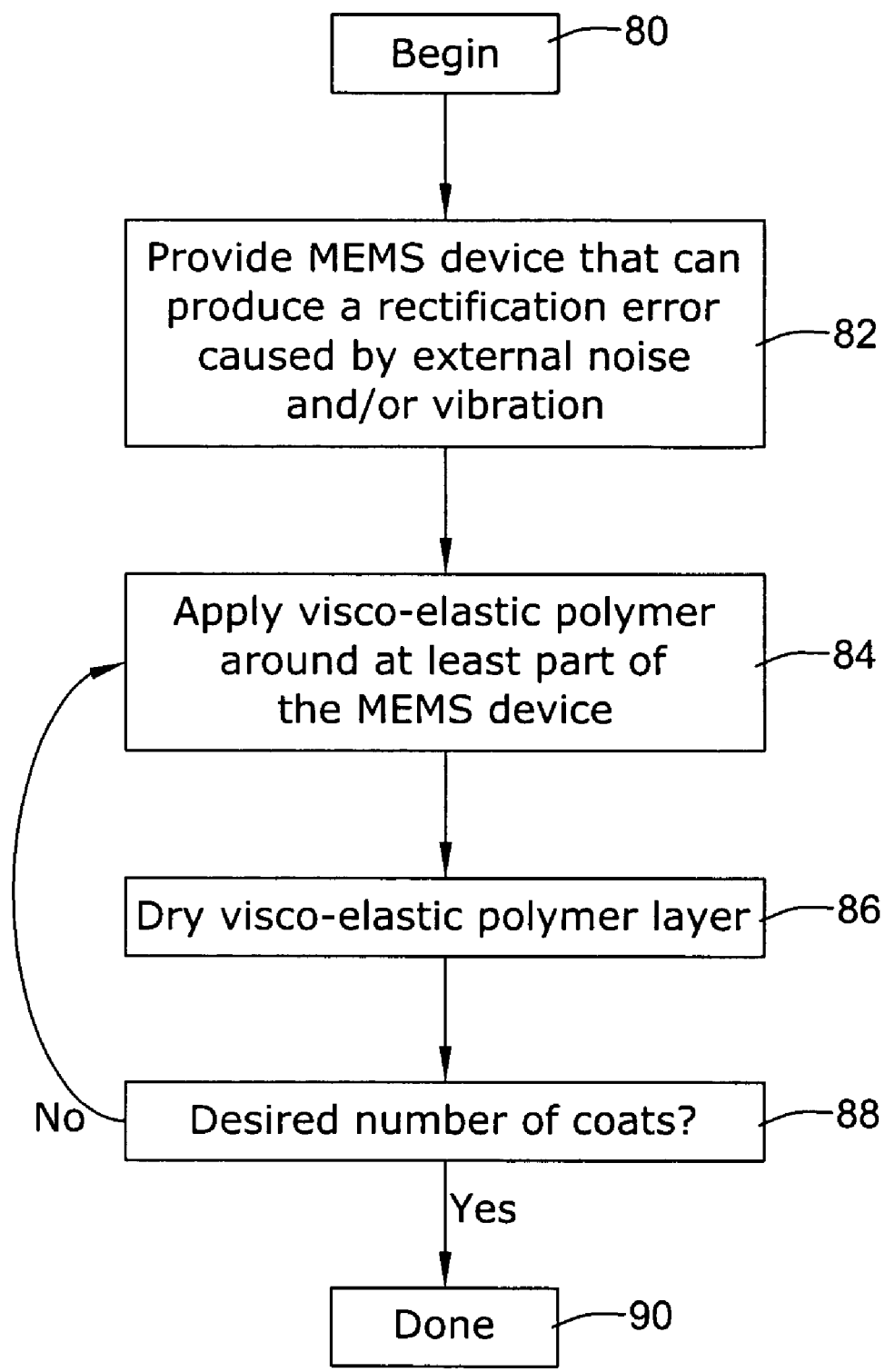
FIG. 7 is a flow diagram of an illustrative method of applying a visco-elastic polymer layer on a MEMS device.

FIG. 7 is a flow diagram of an illustrative method of applying a visco-elastic polymer 30 layer to a MEMS device or system. The method is entered at step 80. At step 82, and in the illustrative method, a MEMS device is provided that can produce a rectification error caused by external noise and/or vibration. At step 84, a visco-elastic polymer layer is applied around at least part of the MEMS device. It is contemplated that the visco-elastic polymer 30 may be applied by spraying, brushing, dipping, blobbing or by any other suitable method or technique, as desired. At step 86, the visco-elastic polymer layer is allowed to dry. In some cases, drying can take between 24 and 48 hours, but this time may vary depending on the conditions (room temperature, humidity, layer thickness, etc.) as well as the particular visco-elastic polymer used and the method of application. Once sufficiently dry, and at step 88, it is determined if the desired number of coats of visco-elastic polymer have been applied. If so, control is passed to step 90, and the method is exited. If not, control is passed back to step 84, wherein another layer is applied. It is contemplated that the thickness, type of visco-elastic polymer, method of application, and other parameters may be the same or different for each of the applied layers.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. A component, comprising:
   a microelectromechanical system (MEMS) device positioned within an enclosure; and
   one or more layers of a visco-elastic polymer situated around at least part of an outer surface of the enclosure, said visco-elastic polymer configured to convert acoustic energy and vibration energy into heat.

2. The component of claim 1, wherein the MEMS device is an inertial measurement unit (IMU).

3. The component of claim 2, wherein the inertial measurement unit (IMU) is adapted for an aeronautical application.

4. The component of claim 2, wherein the inertial measurement unit (IMU) is adapted for a guidance application.

5. The component of claim 2, wherein the inertial measurement unit (IMU) is adapted for a surface vehicle application.

6. The component of claim 2, wherein the inertial measurement unit (IMU) is adapted for a marine application.

7. The component of claim 1, wherein the MEMS device is susceptible to a rectification error caused by an external noise and/or vibration.

8. The component of claim 7, wherein the visco-elastic polymer is adapted to absorb at least some of the external noise and/or vibration.

9. The component of claim 1, wherein the enclosure includes a chassis.

10. The component of claim 1, wherein the enclosure includes a MEMS package.

11. The component of claim 10, wherein the MEMS package is a leadless chip carrier (LCC) package.

12. The component of claim 10, wherein the MEMS package is a multi-chip package (MCP).

13. A component, comprising:
    a microelectromechanical system (MEMS) device positioned in an enclosure; and
    a visco-elastic polymer situated within the enclosure and around at least part of the MEMS device, said visco-elastic polymer configured to convert acoustic energy and vibration energy into heat.

14. The component of claim 13, wherein the MEMS device is an inertial measurement unit (IMU).

15. The component of claim 14, wherein the inertial measurement unit (IMU) is adapted for an aeronautical application.

16. The component of claim 14, wherein the inertial measurement unit (IMU) is adapted for a guidance application.

17. The component of claim 14, wherein the inertial measurement unit (IMU) is adapted for a surface vehicle application.

18. The component of claim 14, wherein the inertial measurement unit (IMU) is adapted for a marine application.

19. The component of claim 13, wherein the MEMS device is susceptible to a rectification error caused by an external noise and/or vibration.

20. The component of claim 19, wherein the visco-elastic polymer is adapted to absorb at least some of the external noise and/or vibration.

21. A component, comprising:
a microelectromechanical system (MEMS) device; and
a visco-elastic polymer situated around at least part of the MEMS device, said visco-elastic polymer configured to convert acoustic energy and vibration energy into heat.

22. The component of claim 21, wherein the MEMS device is an inertial measurement unit (IMU).

23. The component of claim 21, wherein the MEMS device is susceptible to a rectification error caused by an external noise and/or vibration.

24. The component of claim 23, wherein the visco-elastic polymer is adapted to absorb at least some of the external noise and/or vibration.

25. A system, comprising:
a printed circuit board;
a microelectromechanical system (MEMS) device secured relative to the printed circuit board; and
a visco-elastic polymer blobbed over at least part of the MEMS device, said visco-elastic polymer configured to convert acoustic energy and vibration energy into heat.

26. The system of claim 25, wherein the MEMS device is an inertial measurement unit (IMU).

27. The system of claim 25, wherein the MEMS device is susceptible to a rectification error caused by an external noise and/or vibration.

28. The system of claim 27, wherein the visco-elastic polymer is adapted to absorb at least some of the external noise and/or vibration.

* * * * *